(12) United States Patent
Nakaji et al.

(10) Patent No.: US 7,855,400 B2
(45) Date of Patent: Dec. 21, 2010

(54) SEMICONDUCTOR LIGHT DETECTING ELEMENT AND METHOD FOR MANUFACTURING THE SEMICONDUCTOR LIGHT DETECTING ELEMENT

(75) Inventors: Masaharu Nakaji, Tokyo (JP); Eitaro Ishimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/426,391

(22) Filed: Apr. 20, 2009

(65) Prior Publication Data

US 2010/0148216 A1    Jun. 17, 2010

(30) Foreign Application Priority Data

Dec. 17, 2008    (JP) .............................. 2008-321076

(51) Int. Cl.
*H01L 31/102*    (2006.01)
(52) U.S. Cl. ................. 257/184; 438/94; 257/E21.352; 257/E31.019
(58) Field of Classification Search ................. 257/431, 257/446, 452, 458, 466, 184, E31.019, E21.352; 438/94

See application file for complete search history.

(56) References Cited

U.S. PATENT DOCUMENTS

| 6,005,266 A * | 12/1999 | Forrest et al. ............... 257/258 |
| 6,635,908 B2 | 10/2003 | Tanaka et al. |
| 2002/0185702 A1* | 12/2002 | Shirai et al. ................. 257/443 |
| 2008/0308891 A1* | 12/2008 | Boisvert et al. ............. 257/451 |

FOREIGN PATENT DOCUMENTS

| EP | 0 609 884 A1 | 2/1994 |
| JP | 2006-232442 A | 8/1994 |
| JP | 2002-324911 A | 11/2002 |

* cited by examiner

*Primary Examiner*—Trung Dang
(74) *Attorney, Agent, or Firm*—Leydig, Voit & Mayer, Ltd.

(57) ABSTRACT

A semiconductor light detecting element having a mesa structure comprises: a first semiconductor layer having n-type conductivity located on a semiconductor substrate, a light absorbing layer located on the first semiconductor layer, and a second semiconductor layer located on the light absorbing layer; a burying layer burying peripheries of the light absorbing layer and the second semiconductor layer. The burying layer has a band gap larger than the band gap of the light absorbing layer. The second semiconductor layer has a first region having p-type conductivity, and a second region having i-type or n-type conductivity and located between the first region and the burying layer.

12 Claims, 7 Drawing Sheets

SEMICONDUCTOR LIGHT DETECTING ELEMENT AND METHOD FOR MANUFACTURING THE SEMICONDUCTOR LIGHT DETECTING ELEMENT

BACKGROUND OF THE INVENTION

1. Field of the Invention

The present invention relates to a semiconductor light receiving element, more specifically, to a semiconductor light receiving element having a buried mesa structure.

2. Background Art

Generally, the types of semiconductor light receiving elements are roughly classified into a mesa type and a planar type. Among these, although the mesa type had advantage of simple manufacturing process, it had disadvantage of dark current, particularly high surface leakage current and low reliability, because electric fields readily concentrate in the periphery of p-n junction, and minute current paths are easily formed by the surface levels or surface defects formed on the exposed surface. On the other hand, although the planar type had advantage of low dark current and high reliability, because p-n junction is formed in crystals, and the part appeared on the surface has low electric fields, it had disadvantage of a complicated manufacturing process.

As a technique to eliminate disadvantages described above, a structure wherein a burying layer formed on a high-resistance semiconductor crystals containing an adequate concentration of an impurity is formed around a mesa including a p-n junction on a substrate, and the p-n junction is covered by the burying layer to reduce the surface level and the surface defect and lower the surface leakage current has been proposed (for example, refer to Japanese Patent Application Laid-Open No. 6-232442 and Japanese Patent Application Laid-Open No. 2002-324911).

SUMMARY OF THE INVENTION

As shown in these documents, by forming a high-resistance semiconductor layer on the sidewall of a mesa, the defect and interface level on the sidewall of a mesa can be reduced, and dark current can be lowered.

However, as shown in the above documents, in the structure wherein a high-resistance semiconductor layer is formed on the periphery of a p-n junction photodiode, a regrown interface directly contacts a p-type layer or an n-type layer. Even if the defect or interface level on the mesa sidewall of the high-resistance semiconductor layer is reduced, it is difficult to remove them completely, and may cause leak path. It is also a cause of increase in dark current that the impurity in the p-type layer and the n-type layer, and the impurity in the high-resistance semiconductor layer mutually diffuse during regrowing the high-resistance semiconductor layer, and the resistance of the high-resistance semiconductor layer becomes lower than the desired resistance value. As a result of these phenomena, there was a problem wherein dark current, particularly surface leakage current was high compared with a planar-type structure.

To solve problems as described above, it is an object of the present invention to provide a semiconductor light receiving element of low dark current, wherein the surface leak dark current causing the problem in a buried light receiving element wherein the sidewall of a mesa is buried in a high-resistance semiconductor is reduced.

According to one aspect of the present invention, a semiconductor light receiving element having a mesa structure comprises: a first semiconductor layer having an n-type conductivity formed on a semiconductor substrate, a light absorbing layer located on said first semiconductor layer, and a second semiconductor layer located on said light absorbing layer; wherein the periphery of said light absorbing layer and said second semiconductor layer is buried in a burying layer having a band gap larger than the band gap of said light absorbing layer, and said second semiconductor layer comprises a first region having a p-type conductivity, and a second region having an i-type or n-type conductivity between said first region and said burying layer.

According to another aspect of the present invention, a method for manufacturing a semiconductor light receiving element comprises: a first step for forming a first semiconductor layer having an n-type conductivity on a semiconductor substrate, a second step for forming a light absorbing layer on said first semiconductor layer; a third step for forming a second semiconductor layer having an i-type or n-type conductivity on said light absorbing layer; a mesa structure forming step for forming a mesa structure by etching said light absorbing layer and said second semiconductor layer; a burying layer forming step for forming a burying layer having a band gap larger than the band gap of said light absorbing layer and a burying step for burying the periphery of said mesa structure with the burying layer; and a p-type region forming step for forming a region having a p-type conductivity by doping a p-type impurity into a part of said second semiconductor layer so that a region having an i-type or n-type conductivity is left between said burying layer and the p-type region.

In the semiconductor light receiving element according to the present invention, since an i-type or n-type layer is present between the p-type semiconductor having a mesa structure and the burying layer, the surface leakage current that flows in the burying interface can be reduced, and dark current can be lowered.

DETAILED DESCRIPTION OF THE PREFERRED EMBODIMENTS

First Embodiment

Figure 1:
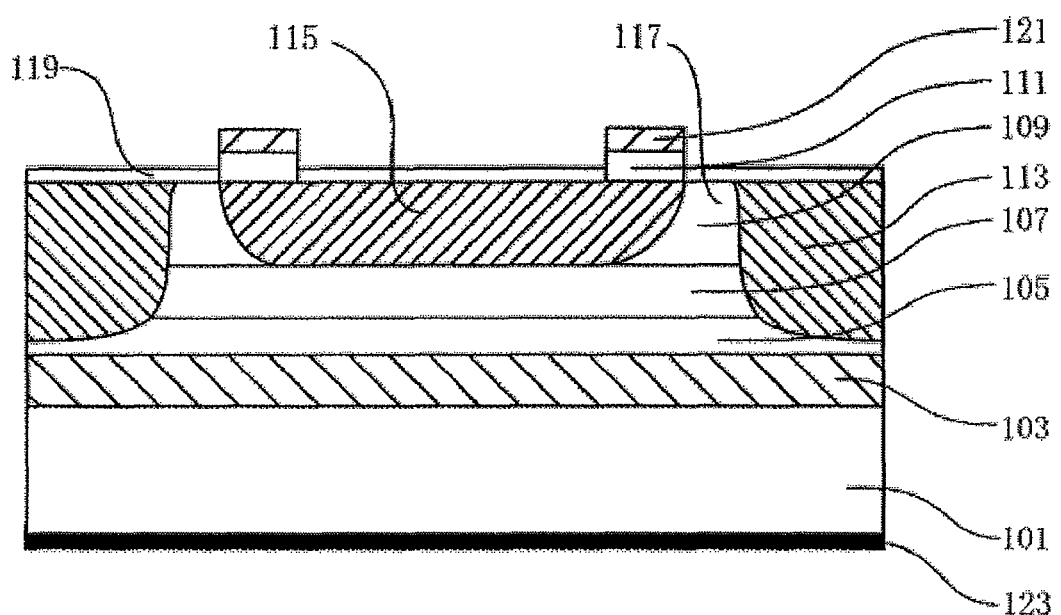
FIG. 1 is a sectional view of a semiconductor light receiving element according to the first embodiment.

FIG. 1 is a sectional view of a semiconductor light receiving element according to the first embodiment. On an n-type InP (n-InP, hereafter "n-type" is indicated as "n-" and "p-type" is indicated as "p-"; further, those wherein no impurities are intentionally doped, or those having the carrier concentration of $1\times10^{16}$/cm or less is referred to as "i-type" and is indicated as "i-") substrate 101, an n-InGaAs conductive layer 103 (impurity concentration: $1\times10^{18}$/cm, thickness: 0.5 μm), an n-InP clad layer 105 (impurity concentration: $1\times10^{18}$/cm, thickness: 1 μm), and an i-InGaAs light absorbing layer 107 (impurity concentration: $1\times10^{15}$/cm, thickness: 2 μm) are formed; and an InP window layer 109 is formed thereon. In the InP window layer 109, a Zn-diffused p-type region 115 (thickness: 1 μm) surrounded by an i-type region 117 (impurity concentration: $1\times10^{15}$/cm, thickness: 1 μm) is formed. On the p-type region 115, a p-InGaAs contact layer 111 (thickness: 0.5 μm) is formed. The peripheries of the n-InP clad layer 105, the i-InGaAs light absorbing layer 107, and the InP window layer 109 are etched to form a mesa structure. On the periphery of the mesa, an Fe-doped InP (Fe-InP) block layer 113 (impurity concentration: $5\times10^{16}$/cm, thickness: about 3 μm) is formed as a burying layer having a larger band gap than the band gap of the i-InGaAs light absorbing layer 107. On the upper surface excluding the area where the p-InGaAs contact layer 111 is formed, an SiN passivation film 119 is formed. On the p-InGaAs contact layer 111, a p-electrode 121 is further formed, and on the bottom surface of the mesa, an n-electrode 123 is formed.

The p-type region 115 is subjected to p-type doping by Zn diffusion. Therefore, no growing interface is present with the surrounding i-type region 117.

Figure 2:
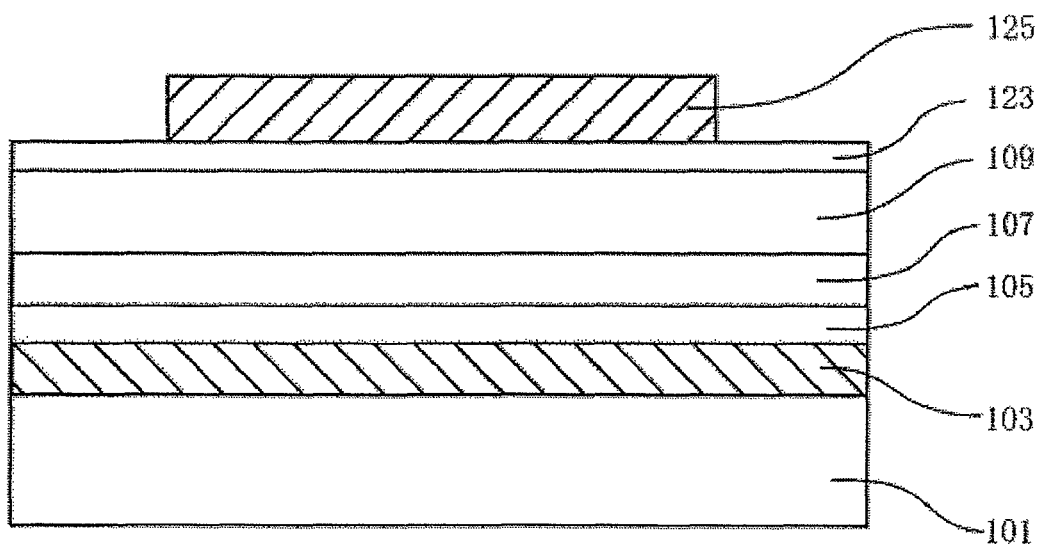
FIGS. 2 to 7 show a method for manufacturing a semiconductor light receiving element according to the first embodiment.

Next, a method for manufacturing a semiconductor light receiving element according to the first embodiment will be described referring to FIGS. 2 to 7. First as shown in FIG. 2, by a crystal growing method, such as metal-organic chemical vapor deposition (MOCVD) and molecular beam epitaxy (MBE), an n-InGaAs conductive layer 103 and an n-InP clad layer 105 are formed on an n-InP substrate 101, an i-InGaAs light absorbing layer 107 and an i-type InP window layer 109 (impurity concentration: $1\times10^{15}$/cm, thickness: 1 μm) are laminated, and after laminating an i-InGaAs layer 123 (impurity concentration: $1\times10^{15}$/cm, thickness: 0.5 nm) thereon, a silicon oxide (SiO$_2$) film 125 is laminated on the i-InGaAs layer 123. Then the SiO$_2$ film 125 is patterned to a predetermined shape using a photolithography technique.

Figure 3:
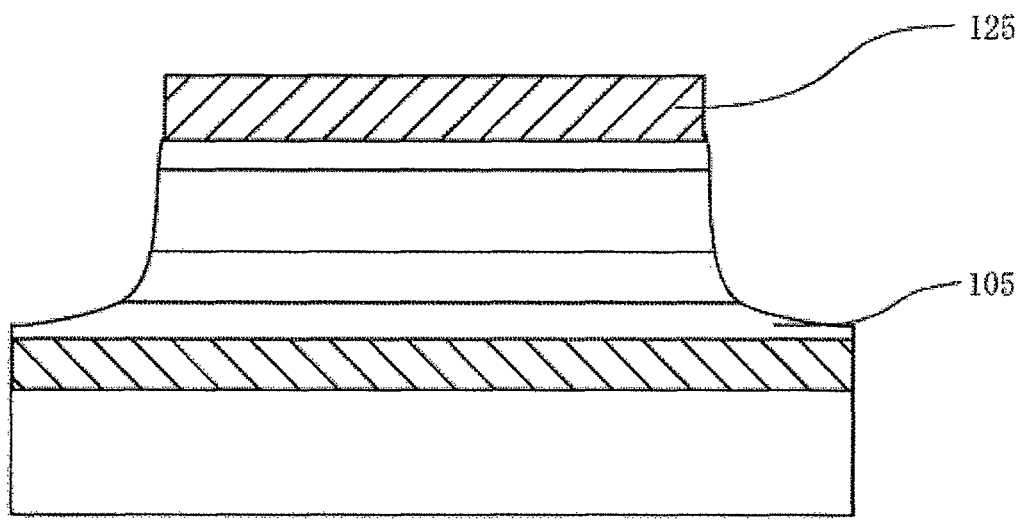

Next, as shown in FIG. 3, a mesa structure (upper diameter: 50 μm) is formed by the combination of dry etching and wet etching using the SiO$_2$ film 125 as a mask. The etching depth is about 3 μm from the surface and controlled to be stopped in the n-InP clad layer 105.

Figure 4:
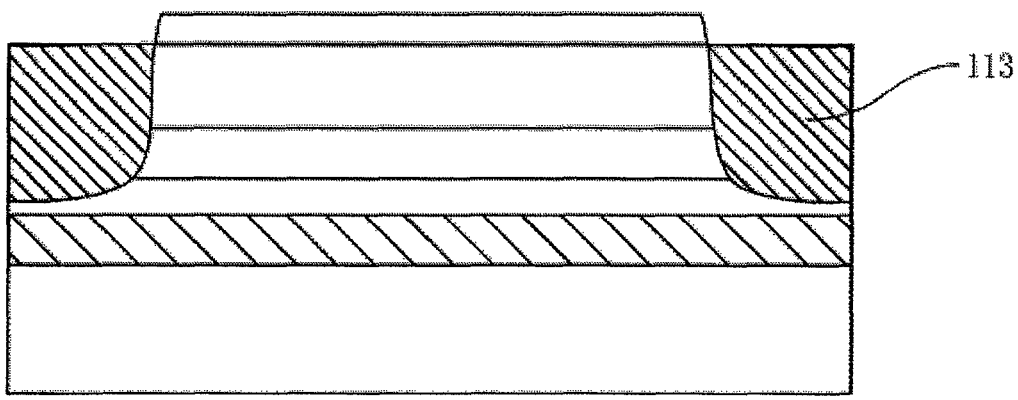

Next, as shown in FIG. 4, an Fe-doped InP (Fe-InP) block layer 113 is selectively grown on the periphery of the mesa using MOCVD or the like, and then, the SiO$_2$ film 125 is removed.

Figure 5:
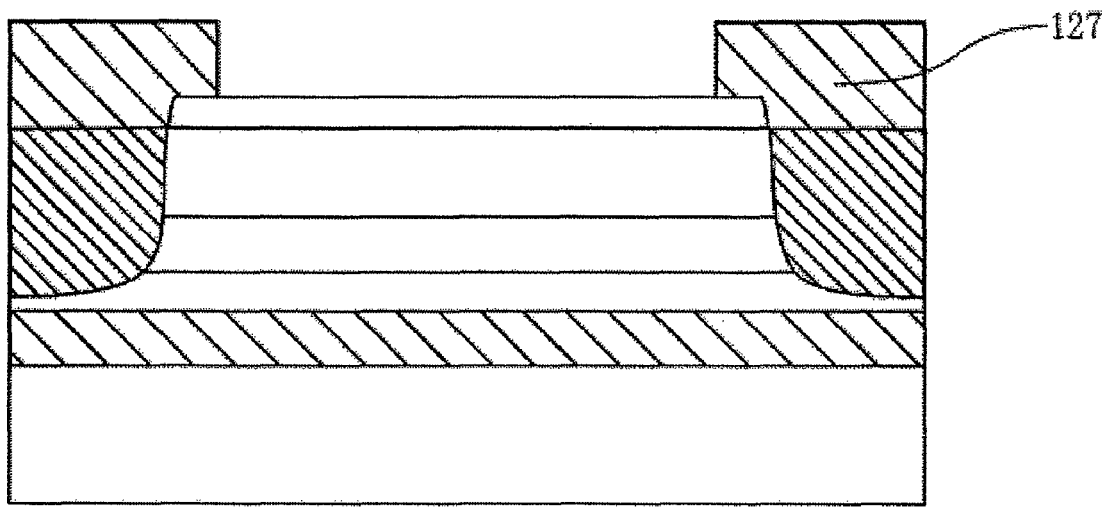

Next, as shown in FIG. 5, an SiO$_2$ film 127 is deposited on the entire surface of the element, and a circular punched pattern is formed so as to have a diameter smaller than the diameter of the mesa (diameter of the punched pattern: 30 μm) using photolithography.

Figure 6:
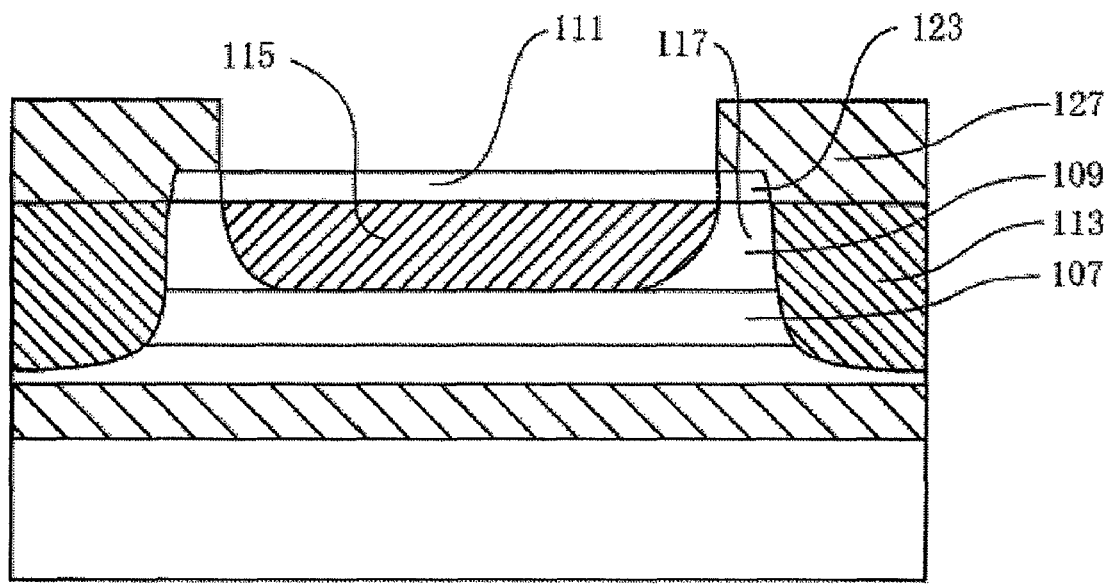

Next, as shown in FIG. 6, Zn is diffused by thermal diffusion using the SiO$_2$ film 127 as a mask to form a p-type region 115 and a p-InGaAs contact layer 111. Zn is diffused until Zn reaches the i-InGaAs light absorbing layer. Here, the p-type region 115 is formed so that an i-type region 117 is left between the p-type region 115 and the Fe-InP block layer 113. Although the diffusion of Zn reaches the i-InGaAs light absorbing layer 107, if the diffusion depth is less than about 200 nm, the characteristics are not affected even if Zn is diffused into the i-InGaAs light absorbing layer 107.

Figure 7:
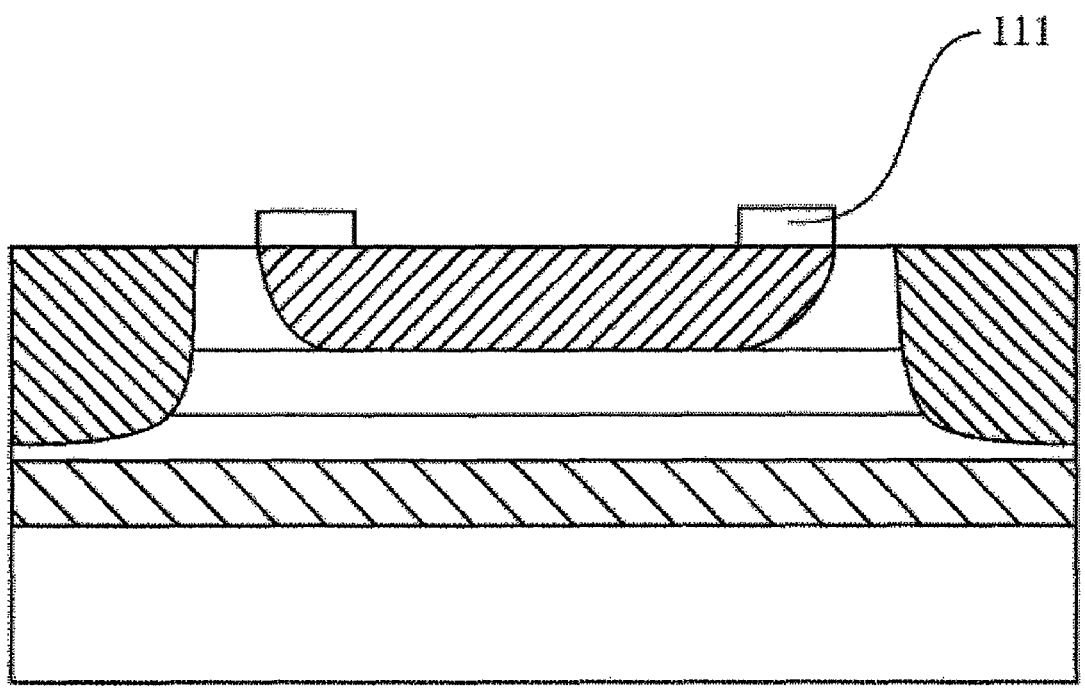

Next, as shown in FIG. 7, after removing the SiO$_2$ film 127 a mask, the i-InGaAs layer 123 and the p-InGaAs contact layer 111 are partially removed. Thereafter, an SiN passivation film 119 and p-electrode 121 is formed on the surface of the element. Finally, after polishing the back face, an n-electrode 123 is formed to fabricate the semiconductor light receiving element according to the first embodiment.

The dark current of an ordinary light receiving element can be expressed by four components: diffusion current (Idd), generated recombination current (Ig), surface leakage current (Is), and tunnel current (It). Of these, in the case of a pin-PD having a planar type used in relatively small reverse bias, or APD wherein avalanche breakdown occurs, the diffusion current and the generated recombination current are dominant, and the dark current (Id) at operation voltage can be represented by the following equation:

$$Id \propto \exp[-qEg/nkT] \quad \text{(Equation 1)}$$

where q is elementary charge $1.60\times10^{-19}$ C, Eg is the band gap of the depletion layer, k is the Boltzmann constant $8.62\times10^{-5}$ eV/K. n is a factor varied by the ratio of the diffusion current to the generated recombination current within a range between 1 and 2, and T is absolute temperature.

However, in the case of a mesa structure, surface leakage current is often generated due to the surface level or surface defect formed on the exposed surface. Generally, the surface leakage current can be represented by the following equation:

$$Is = qni\sqrt{\pi}A \cdot WsS \quad \text{(Equation 2)}$$

where ni is intrinsic carrier concentration, A is p-n junction area, Ws is the width of the depletion layer, and S is surface recombination rate.

As seen from Equation 2, since no temperature factors are included in the equation of the surface leakage current, little surface leakage current is varied even if the temperature is varied. While in Equation 1, the factor of temperature is included in the equation, and dark current is significantly varied by the temperature. Therefore, the equation of dark current taking surface leakage current components in consideration can be expressed by:

$$Id \cdot \propto \exp[-qEa/kT] \quad \text{(Equation 3)}$$

where, Ea is activation energy. When the obtained activation energy equals to Eg, diffusion current from the exterior of the depletion layer region is evaluated as dominant. When the obtained activation energy equals to 1/2Eg, generated recombination current is evaluated as dominant. Furthermore, when Ea<1/2Eg, it is considered that surface leakage current is included, and as Ea is smaller the surface leakage current components become increased.

Figure 8:
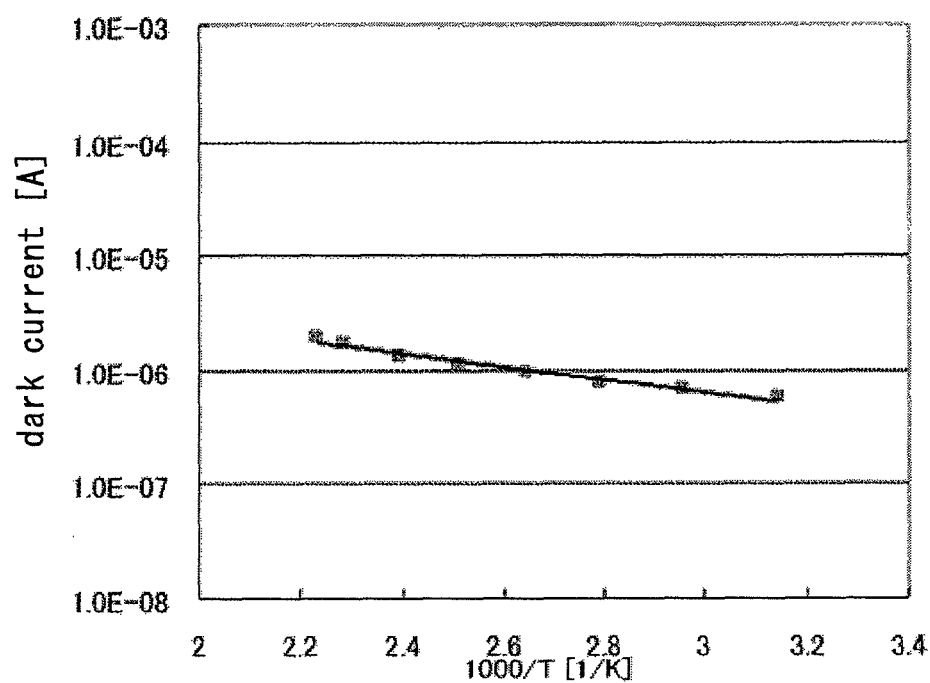
FIG. 8 shows the temperature characteristics of the conventional semiconductor light receiving element.

Here, the temperature characteristics of a conventional semiconductor light receiving element at an operation voltage of −3 V are shown in FIG. 8. The activation energy (Ea) obtained from FIG. 8 is 0.11 eV. This is a significantly smaller value than the values of the band gap of InP or InGaAs, which is the material composing the element (1.35 eV and 0.77 eV, respectively). It is said from this fact that surface leakage current is dominant in the dark current.

Figure 9:
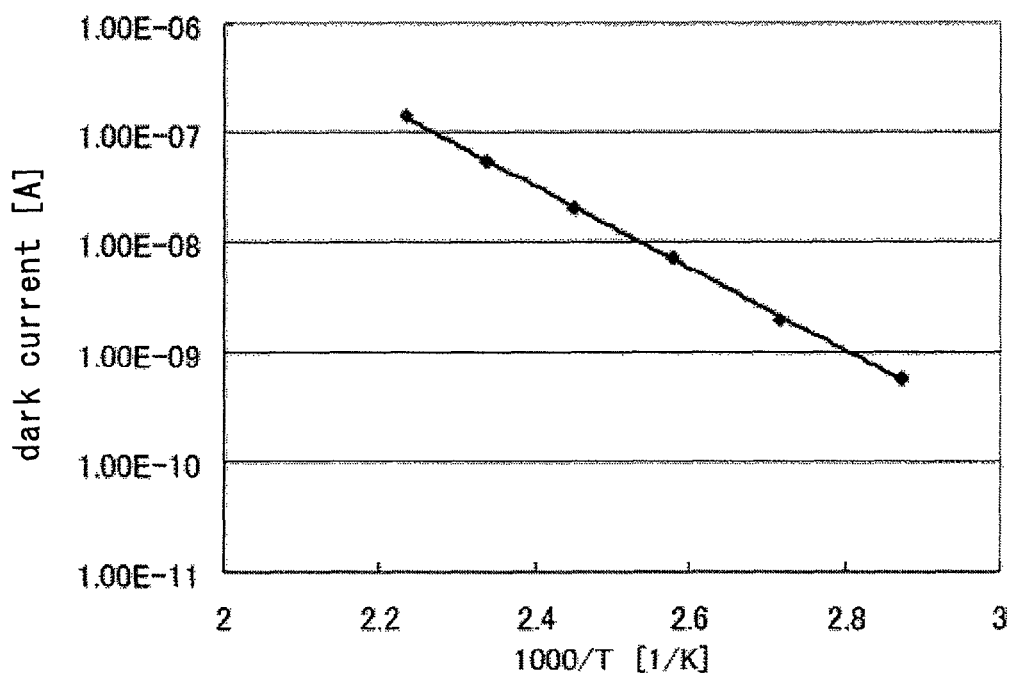
FIG. 9 shows the temperature characteristics of the semiconductor light receiving element according to the first embodiment.

While in the semiconductor light receiving element according to the first embodiment, the dark current could be lowered to 1 nA or less at an operation voltage of −3 V, and the dark current value equivalent to the value in the planar type elements could be realized. The temperature characteristics of dark currents are shown in FIG. 9. The activation energy of the dark currents obtained from these values was 0.74 eV. Therefore, since this value is nearly a half the band gap of InP, which is the material composing the element (1.35 eV) and nearly same as the band gap of InGaAs (0.77 eV), it is said that diffusion current or generated recombination current is dominant in the dark current. From this fact, according to the present invention, the leakage current in the mesa portion can be reduced, and a semiconductor light receiving element with little dark current can be fabricated.

Second Embodiment

Figure 10:
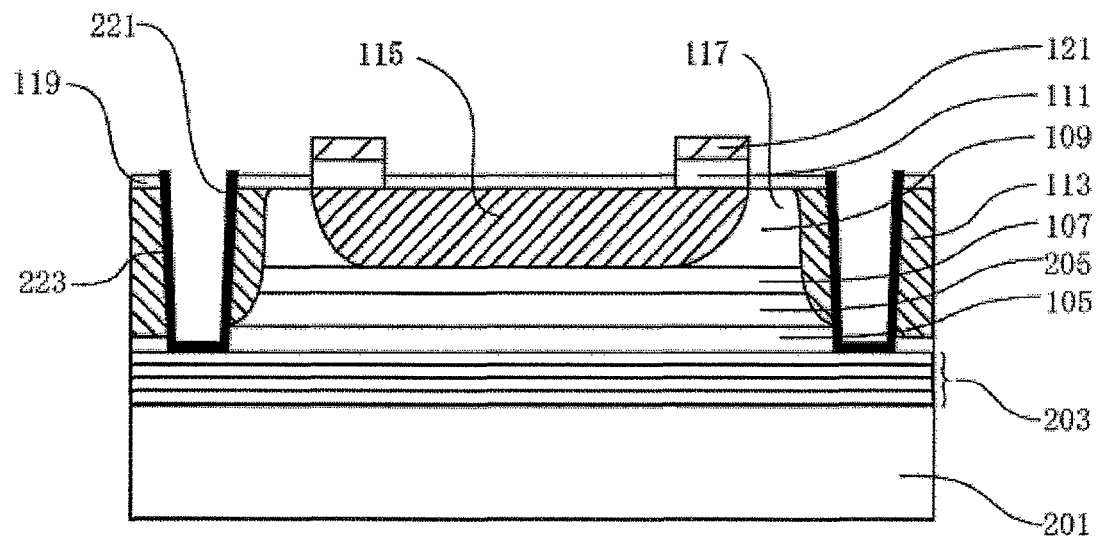
FIG. 10 is a sectional view showing a semiconductor light receiving element according to the second embodiment.

FIG. 10 is a sectional view showing a semiconductor light receiving element according to another embodiment of the present invention. In the second embodiment, the present invention is applied to a pin-PD for ultrahigh-speed reception.

In the semiconductor light receiving element according to the second embodiment, an n-InP/InGaAs multilayer reflection film 203 (impurity concentration: $1 \times 10^{18}$/cm, thickness: 6 pairs of 0.125/0.115 μm), an n-InP clad layer 105 (impurity concentration: $1 \times 10^{18}$/cm, thickness: 0.5 μm), an i-InP electron transit layer 205 (impurity concentration: $1 \times 10^{18}$/cm, thickness: 0.15 μm), and an i-InGaAs light absorbing layer 107 (impurity concentration: $1 \times 10^{15}$/cm, thickness: 1 μm) are formed on a Fe-InP substrate 201; and an InP window layer 109 is formed thereon. In the InP window layer 109, a Zn-diffused p-type region 115 (thickness: 1 μm) surrounded by an i-type region 117 (impurity concentration: $1 \times 10^{15}$/cm, thickness: 1 μm) is formed. On the p-type region 115, a p-InGaAs contact layer 111 (thickness: 0.5 μm) is formed. The peripheries of the n-InP clad layer 105, the i-InP electron transit layer 205, the i-InGaAs light absorbing layer 107, and the InP window layer 109 are etched to form a mesa structure. The etching depth is about 2.7 μm from the surface, and the upper diameter of the mesa is 50 μm. On the periphery of the mesa, an Fe-InP block layer 113 (impurity concentration: $5 \times 10^{16}$/cm, thickness: about 2.7 μm) is formed. From the upper surface, a cathode contact hole 223 reaching the n-InP/InGaAs multilayer reflection film 203 from the upper surface of the Fe-InP block layer 113 is formed, and the n-electrode 221 is formed thereon. On the upper surface of the element excluding the area where the p-InGaAs contact layer 111 is formed and the n-electrode 221, an SiN passivation film 119 is formed. On the p-InGaAs contact layer 111, a p-electrode 121 is further formed.

In the second embodiment, by leaving the i-type region between the Zn-diffused region and the Fe-InP block layer in the same manner as in the first embodiment, the surface leakage current that flows in the burying interface can be reduced, and a light receiving element having little dark current can be fabricated. Even by such a semiconductor light receiving element, the effect equivalent to the effect of the first embodiment can be obtained.

Third Embodiment

Figure 11:
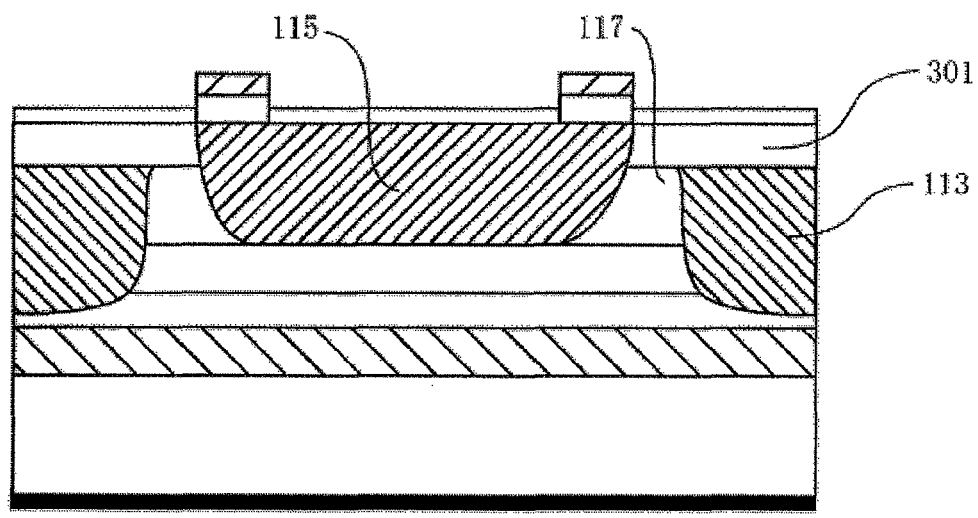
FIG. 11 is a sectional view showing a semiconductor light receiving element according to the third embodiment.

FIG. 11 is a sectional view showing a semiconductor light receiving element according to another embodiment of the present invention. The semiconductor light receiving element according to the third embodiment, an i-type, n-type, or Fe-doped InP layer 301 on an Fe-InP block layer 113 and the i-type region 117 of an InP window layer 109 are formed. The p-type region 115 is formed by diffusing Zn to convert the predetermined region of the InP window layer 109 and the InP layer 301 to p-type after forming the i-type, n-type, or Fe-doped InP layer 301 on the InP window layer 109. Other configurations are same as the configurations of the first embodiment.

In the third embodiment, the i-type region, and the i-type, n-type, or Fe-doped InP layer 301 is formed between the Zn-diffused region and the Fe-InP block layer. Thereby, since the surface leakage current that flows in the burying interface can be reduced in the same manner as in the first embodiment, a light receiving element having little dark current can be fabricated. Therefore, even by such a semiconductor light receiving element, the effect equivalent to the effect of the first embodiment can be obtained.

Fourth Embodiment

Figure 12:
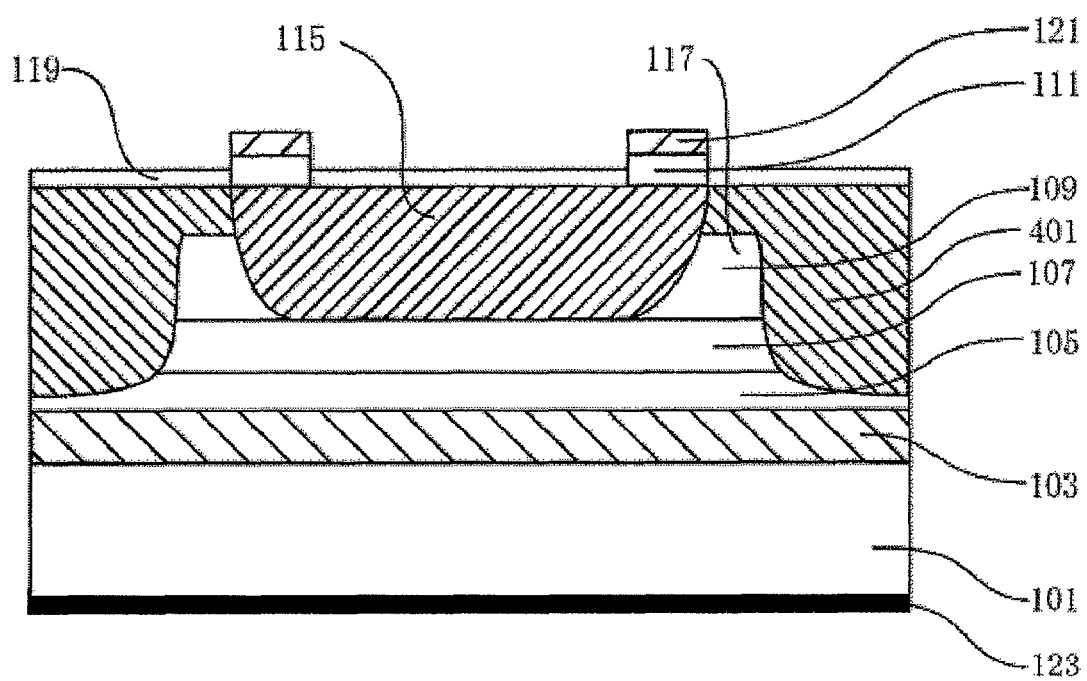
FIG. 12 is a sectional view showing a semiconductor light receiving element according to the fourth embodiment.

FIG. 12 is a sectional view showing a semiconductor light receiving element according to another embodiment of the present invention.

In the semiconductor light receiving element according to the fourth embodiment, on an n-InP substrate 101, an n-InGaAs conductive layer 103 (impurity concentration: $1 \times 10^{18}$/cm, thickness: 0.5 μm), an n-InP clad layer 105 (impurity concentration: $1 \times 10^{18}$/cm, thickness: 1 μm), and an i-InGaAs light absorbing layer 107 (impurity concentration: $1 \times 10^{15}$/cm, thickness: 2 μm) are formed; and an InP window layer 109 is formed thereon. A Zn-diffused p-type region 115 (thickness: 1 μm) is surrounded by an i-type region 109 (impurity concentration: $1 \times 10^{15}$/cm, thickness: 0.1 μm) and an Fe-InP block layer 401. On the p-type region 115, a p-InGaAs contact layer 111 (thickness: 0.5 μm) is formed. The peripheries of the n-InP clad layer 105, the i-InGaAs light absorbing layer 107, and the InP window layer 109 are etched to form a mesa structure. The etching depth is about 2.5 μm from the surface, and the upper diameter of the mesa is 50 μm. In the method for forming the p-type region 115, the p-InGaAs contact layer 111, and the Fe-InP block layer 401, after forming an i-type InP layer on the i-InGaAs light absorbing layer 107 (impurity concentration: $1 \times 10^{15}$/cm, thickness: 0.1 μm), a mesa structure is formed by the etching process described above, an Fe-InP layer (impurity concentration: $5 \times 10^{16}$/cm, thickness: about 2.5 μm) and an i-InGaAs layer (impurity concentration: $1 \times 10^{15}$/cm, thickness: about 0.5 μm) are selectively grown on the periphery of the mesa and the i-InP on the mesa, a silicon oxide film mask is formed using photolithography in the same manner as in the first embodiment, and Zn is diffused using thermal diffusion. By the diffusion of Zn, the i-InP layer, Fe-InP layer, and i-InGaAs layer of the upper mesa are converted to the p-type, and the p-type-converted region in the Fe-InP layer is made to be a p-type region 115 and the p-type-converted InGaAs layer is partially removed to form a p-InGaAs contact layer 111. On the upper surface excluding the area where the p-InGaAs contact layer 111 is formed, an SiN passivation film 119 is formed. On the p-InGaAs contact layer 111, a p-electrode 121 is further formed, and on the bottom surface of the mesa, an n-electrode 123 is formed.

In the fourth embodiment, the surface leakage current that flows in the burying interface can be reduced, and a light receiving element having little dark current can be fabricated, by leaving the i-InP layer between the Zn-diffused region and the Fe-InP block layer in the same manner as in the first embodiment. Even such a semiconductor light receiving element, the effect equivalent to the effect of the first embodiment can be obtained.

Fifth Embodiment

Figure 13:
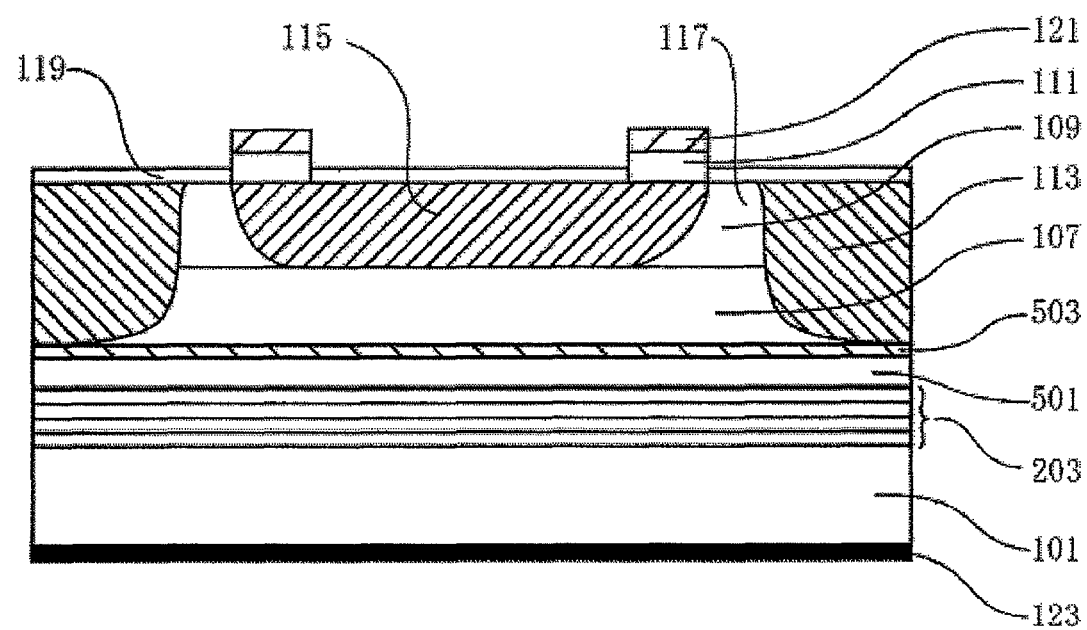
FIG. 13 is a sectional view showing a semiconductor light receiving element according to the fifth embodiment.

FIG. 13 is a sectional view showing a semiconductor light receiving element according to another embodiment of the present invention. In the fifth embodiment, the present invention is applied to a buried APD using AlInAs as a multiplier layer.

In the semiconductor light receiving element according to the fifth embodiment, on an n-InP substrate 101, an n-InP/

InGaAs multilayer reflection film 203 (impurity concentration: $1\times10^{18}$/cm, thickness: 6 pairs of 0.125/0.115 µm), an InAlAs multiplier layer 501 (impurity concentration: $1\times10^{15}$/cm, thickness: 0.2 µm), a p-InP electric field control layer 503 (impurity concentration: $7\times10^{17}$/cm, thickness: 0.05 µm), and an i-InGaAs light absorbing layer 107 (impurity concentration: $1\times10^{15}$/cm, thickness: 1 µm) are formed; and an InP window layer 109 is formed thereon. In the InP window layer 109, a Zn-diffused p-type region 115 (thickness: 1 µm) surrounded by an i-type region 117 (impurity concentration: $1\times10^{15}$/cm, thickness: 1 µm) is formed. On the p-type region 115, a p-InGaAs contact layer 111 (thickness: 0.5 µm) is partially formed. The peripheries of the i-InGaAs light absorbing layer 107, and the InP window layer 109 are etched to form a mesa structure. If the InAlAs multiplier layer 501 is exposed in the time of etching, surface roughing is caused in subsequently performed crystal growth. Therefore, for example, a phosphoric acid etchant is used in etching to stop etching at the p-InP electric field control layer 503. The upper diameter of the mesa is 50 µm. An Fe-InP block layer 113 is formed on the periphery of the mesa. On the upper surface of the element excluding the area where the p-InGaAs contact layer 111 is formed, a SiN passivation film 119 is formed. On the p-InGaAs contact layer 111, a p-electrode 121 is formed, and on the back face thereof, an n-electrode 123 is formed.

In the fifth embodiment, since the i-type region is formed between the Zn-diffused region and the Fe-InP block layer in the same manner as in the first embodiment, the surface leakage current that flows in the burying interface can be reduced, and a light receiving element having little dark current can be fabricated. Even by such a semiconductor light receiving element, the effect equivalent to the effect of the first embodiment can be obtained.

In the fifth embodiment, although an InGaAs layer is used as the absorbing layer, the absorbing layer may be formed of a multilayer structure including an InGaAs layer. Although an InP layer is used as the layer wherein Zn is diffused, the layer may be formed of a multilayer structure including an InP layer, or may be formed of an AlInAs layer or a multilayer structure including an AlInAs layer.

Although Zn is diffused using thermal diffusion in the fifth embodiment, Zn doping can be performed by other diffusing method, or methods other than diffusion. Furthermore, a p-type dopant other than Zn can also be used.

In the specification and drawings, although typical and favorable embodiments of the present invention is disclosed, and specific terms are used, these are only used to describe general and descriptive meanings, and it is needless to say that these are not intended to limit the scope of the claims described in the specification.

As described above, the semiconductor light receiving element according to the present invention is suitable for a semiconductor light receiving element having a buried mesa structure.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-321076, filed on Dec. 17, 2008 including specification, claims, drawings and summary, on which the Convention priority of the present application is based, are incorporated herein by reference in its entirety.

What is claimed is:

1. A semiconductor light detecting element having a mesa structure comprising:
   a semiconductor substrate;
   a first semiconductor layer having n-type conductivity and supported by said semiconductor substrate,
   a semiconductor light absorbing layer supported by said first semiconductor layer,
   a second semiconductor layer located on and contacting said light absorbing layer; and
   a semiconductor burying layer burying peripheries of said semiconductor light absorbing layer and said second semiconductor layer, said semiconductor burying layer having a band gap larger than the band gap of said semiconductor light absorbing layer, wherein said second semiconductor layer comprises a first region having p-type conductivity, and a second region having i-type or n-type conductivity, the second region being located between said first region and said semiconductor burying layer.

2. The semiconductor light detecting element according to claim 1, wherein said semiconductor light absorbing layer comprises an InGaAs layer.

3. The semiconductor light detecting element according to claim 1, wherein said second semiconductor layer comprises one of an InP layer and an AlInAs layer.

4. A method for manufacturing a semiconductor light detecting element comprising:
   forming a first semiconductor layer having n-type conductivity supported by a semiconductor substrate,
   forming a semiconductor light absorbing layer supported by said first semiconductor layer;
   forming a second semiconductor layer having i-type or n-type conductivity on said light absorbing layer;
   forming a mesa structure by etching and removing peripheral parts of said semiconductor light absorbing layer and said second semiconductor layer;
   forming a semiconductor burying layer having a band gap larger than the band gap of said semiconductor light absorbing layer, burying the periphery of said mesa structure; and
   forming a p-type region having p-type conductivity by placing a p-type impurity in a part of said second semiconductor layer so that a region having i-type or n-type conductivity is left between said semiconductor burying layer and said p-type region.

5. The method for manufacturing a semiconductor light detecting element according to claim 4, including thermally diffusing said p-type impurity into said second semiconductor layer.

6. The method for manufacturing a semiconductor light detecting element according to claim 4, wherein said semiconductor burying layer comprises Fe-doped InP.

7. The semiconductor light detecting element according to claim 1, wherein said semiconductor burying layer comprises Fe-doped InP.

8. The semiconductor light detecting element according to claim 1, including an electrode on said substrate.

9. The semiconductor light detecting element according to claim 1, including;
   an n-type semiconductor reflection film located on and in physical and electrical contact with said semiconductor substrate;
   a recess extending through said semiconductor burying layer and reaching said reflection film; and
   an electrode in the recess and making electrical contact to and said substrate.

10. The semiconductor light detecting element according to claim 1, wherein said semiconductor burying layer is spaced from and does not reach said first region.

11. The semiconductor light detecting element according to claim 1, wherein at least part of said semiconductor burying layer is in contact with said first region.

12. The semiconductor light detecting element according to claim 1, including a semiconductor reflection film and a multiplier layer between said semiconductor substrate and said first semiconductor layer.

* * * * *